(12) United States Patent
Pogge et al.

(10) Patent No.: US 7,049,697 B2
(45) Date of Patent: May 23, 2006

(54) PROCESS FOR MAKING FINE PITCH CONNECTIONS BETWEEN DEVICES AND STRUCTURE MADE BY THE PROCESS

(75) Inventors: H. Bernhard Pogge, Hopewell Junction, NY (US); Chandrika Prasad, Wappingers Falls, NY (US); Roy Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 10/606,425

(22) Filed: Jun. 26, 2003

(65) Prior Publication Data

US 2005/0173800 A1  Aug. 11, 2005

Related U.S. Application Data

(60) Division of application No. 10/213,872, filed on Aug. 6, 2002, now Pat. No. 6,737,297, which is a continuation-in-part of application No. 09/669,531, filed on Sep. 26, 2000, now Pat. No. 6,444,560.

(51) Int. Cl.
*H01L 23/34* (2006.01)
*H01L 23/48* (2006.01)
*H01L 23/52* (2006.01)

(52) U.S. Cl. ............... 257/723; 257/712; 257/713; 257/707; 257/778; 257/724; 257/774; 257/737

(58) Field of Classification Search ............... 257/723, 257/686, 707, 712, 713, 778, 787, 724, 774, 257/737
See application file for complete search history.

(56) References Cited

U.S. PATENT DOCUMENTS

| | | | |
|---|---|---|---|
| 4,670,770 A | 6/1987 | Tai | |
| 4,783,695 A | 11/1988 | Eichelberger et al. | |
| 4,884,122 A | 11/1989 | Eichelberger et al. | |
| 4,933,042 A | 6/1990 | Eichelberger et al. | |
| 4,949,148 A | 8/1990 | Bartelink | |
| 5,019,535 A | 5/1991 | Wojarowski et al. | |
| 5,258,236 A | 11/1993 | Arjavalingam et al. | |
| 5,353,498 A | 10/1994 | Fillion et al. | |
| 5,373,627 A | 12/1994 | Grebe | |
| 5,870,289 A * | 2/1999 | Tokuda et al. | ............... 361/779 |
| 5,998,868 A | 12/1999 | Pogge et al. | |
| 6,025,638 A | 2/2000 | Pogge et al. | |

(Continued)

FOREIGN PATENT DOCUMENTS

EP   1041624   10/2000

OTHER PUBLICATIONS

J. Pilchowski et al., "Silicon MCM with Fully Integrated Cooling," HDI Magazine, May 1998, p. 48.

(Continued)

*Primary Examiner*—Nitin Parekh
(74) *Attorney, Agent, or Firm*—Ira D. Blecker

(57) ABSTRACT

A semiconductor device structure including fine-pitch connections between chips is fabricated using stud/via matching structures. The stud and via are aligned and connected, thereby permitting fine-pitch chip placement and electrical interconnections. A chip support is then attached to the device. A temporary chip alignment structure includes a transparent plate exposed to ablating radiation; the plate is then detached and removed. This method permits interconnection of multiple chips (generally with different sizes, architectures and functions) at close proximity and with very high wiring density. The device may include passive components located on separate chips, so that the device includes chips with and without active devices.

4 Claims, 12 Drawing Sheets

U.S. PATENT DOCUMENTS

| | | | |
|---|---|---|---|
| 6,066,513 | A | 5/2000 | Pogge et al. |
| 6,087,199 | A | 7/2000 | Pogge et al. |
| 6,110,806 | A | 8/2000 | Pogge |
| 6,130,823 | A * | 10/2000 | Lauder et al. .............. 361/760 |
| 6,355,501 | B1 | 3/2002 | Fung et al. |
| 6,586,835 | B1 * | 7/2003 | Ahn et al. .................. 257/717 |

OTHER PUBLICATIONS

J. Wolf et al., "System Integration for High Frequency Applications," Intl. J. of Microelectronics and Electronic Packaging 21, 119 (1998).

C.A. Armiento et al., "Gigabit Transmitter Array Modules on Silicon Waferboard," IEEE Transactions on Components, Hybrids and Manufacturing Technology 15, 1072 (1992).

M. Töpper et al., "Embedding Technology—A Chip-First Approach Using BCB," 1997 Intl. Symposium on Advanced Packaging Materials, p. 11.

Jeffrey T. Butler et al., "Advanced Multichip Module Packaging of Micromechanical Systems," 1997 Intl. Conf. on Solid-State Sensors and Actuators, p. 261.

Robert Boudreau et al., "Wafer Scale Photonic-Die Attachment," IEEE Trans. on Components, Packaging and Manufacturing Technology-Part B, 21, 1070 (1998).

Z. Xiao et al., "Low Temperature Silicon Wafer-to-Wafer Bonding with Nickel Silicide," J. Electrochem. Soc. 145, 1360 (1998).

R. Fillion et al., "Plastic Encapsulated MCM Technology for High Volume, Low Cost Electronics," Circuit World 21, 28 (1995).

"A Novel Chip-Stack Package"—Solid State Technology, Apr. 2002, www.solid-state.com, pp. S19-S22, Eric Beyne, IMEC, Leuven, Belgium.

* cited by examiner

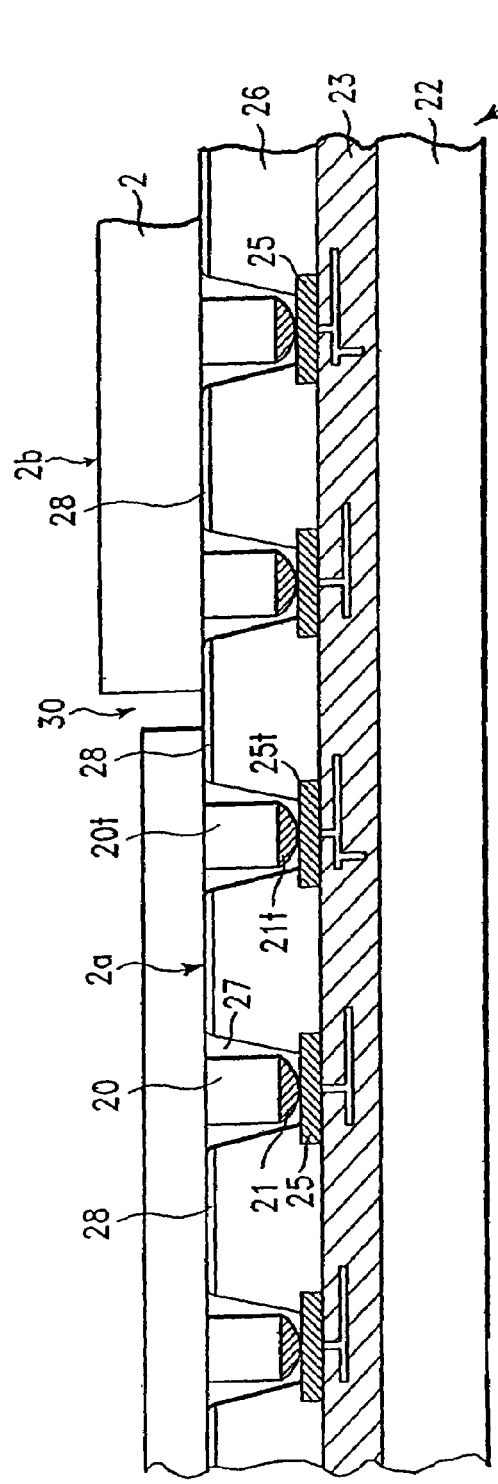
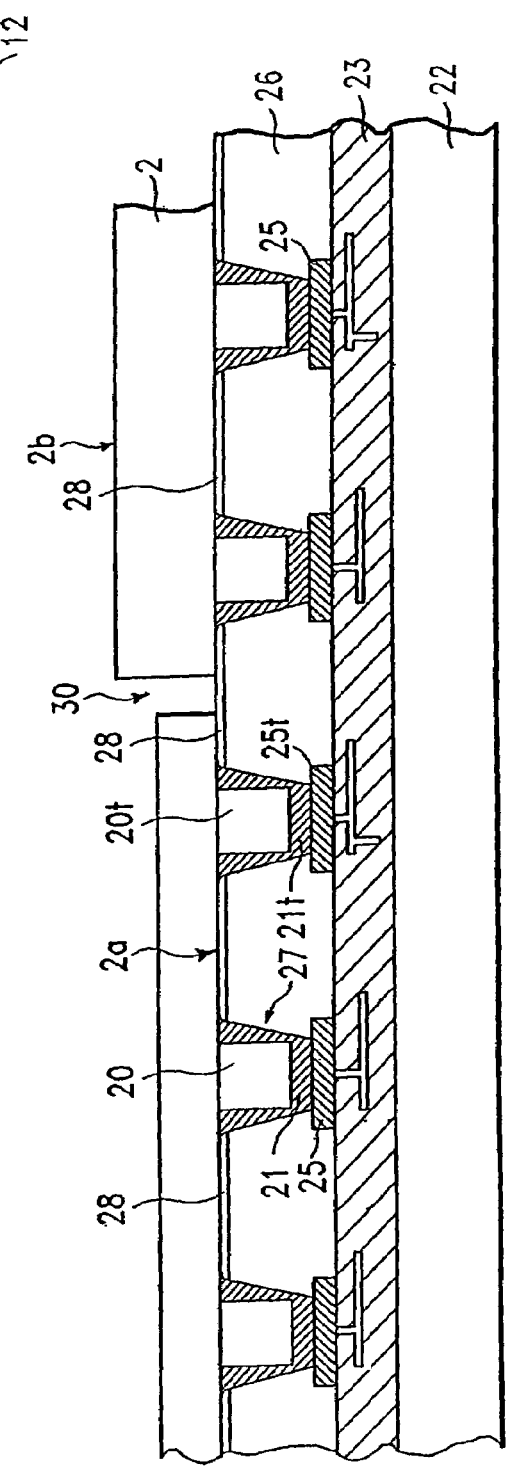
FIG. 3A
FIG. 3B

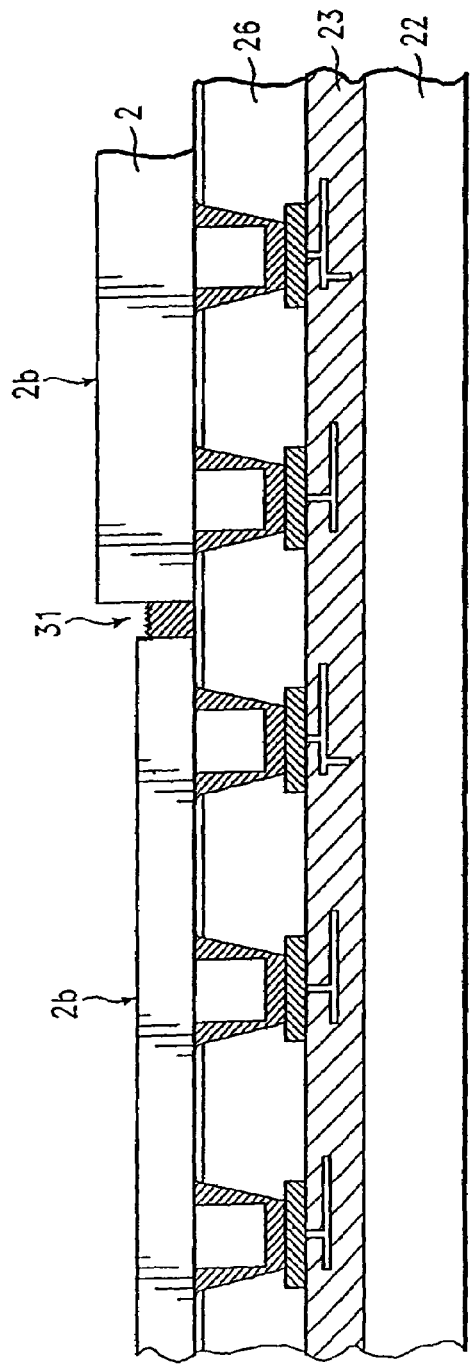
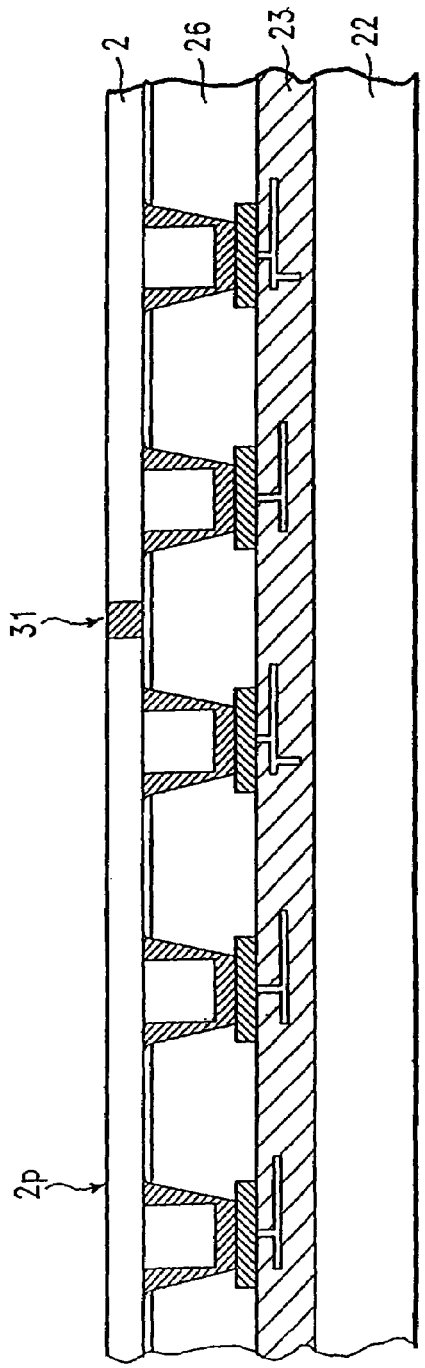
FIG. 3C
FIG. 3D

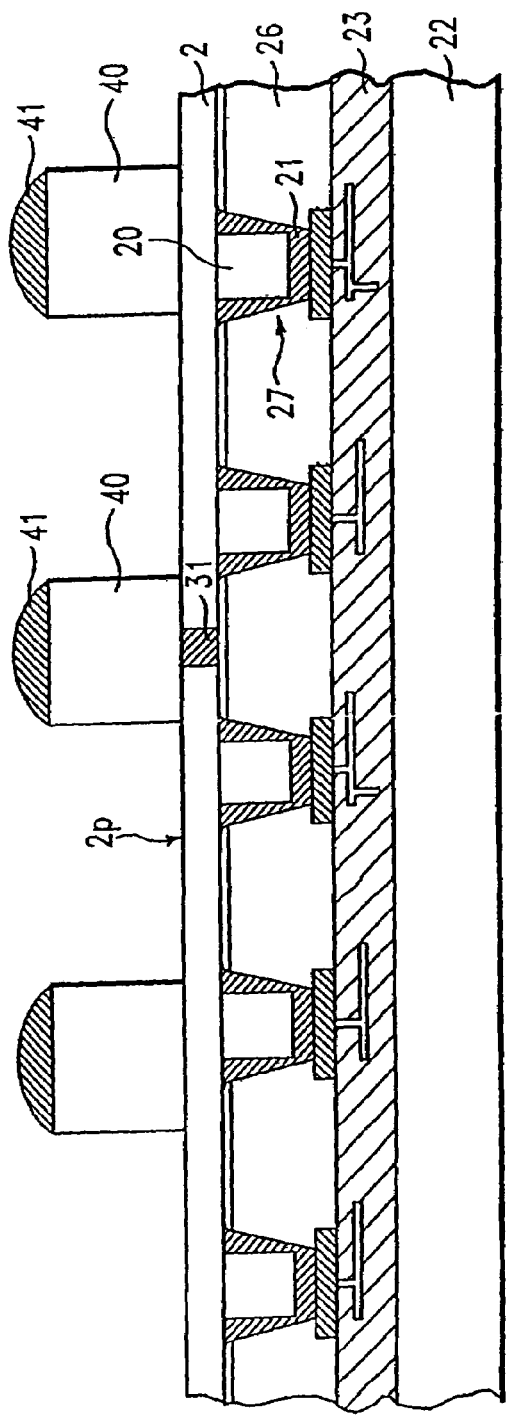
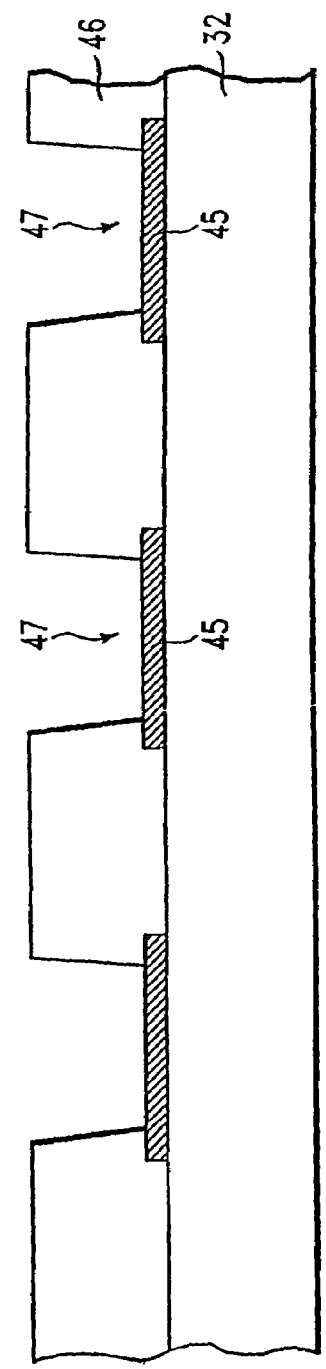
FIG. 4A
FIG. 4B

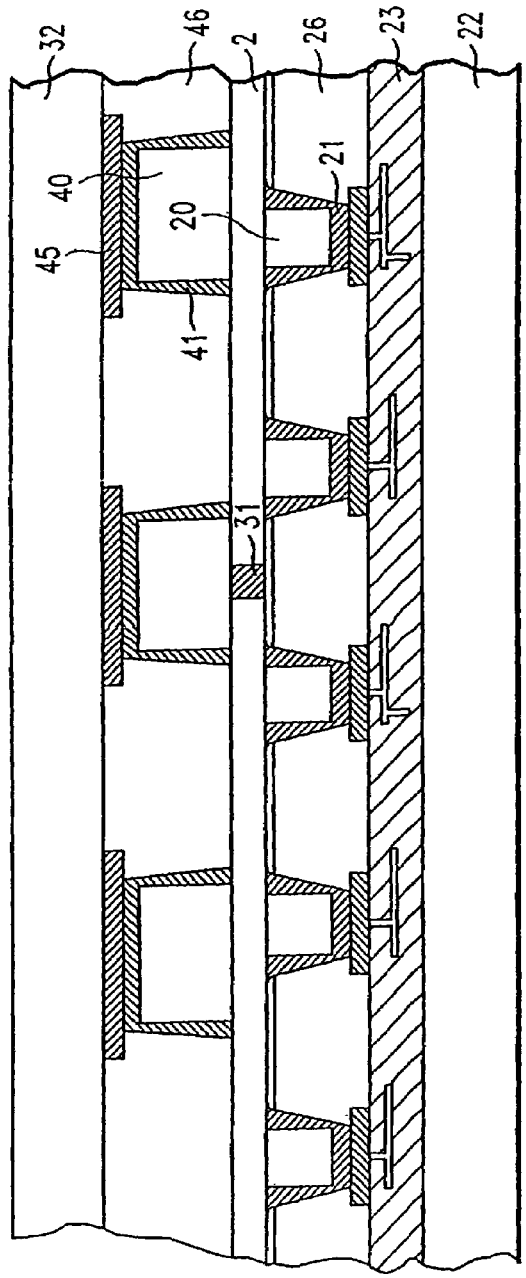
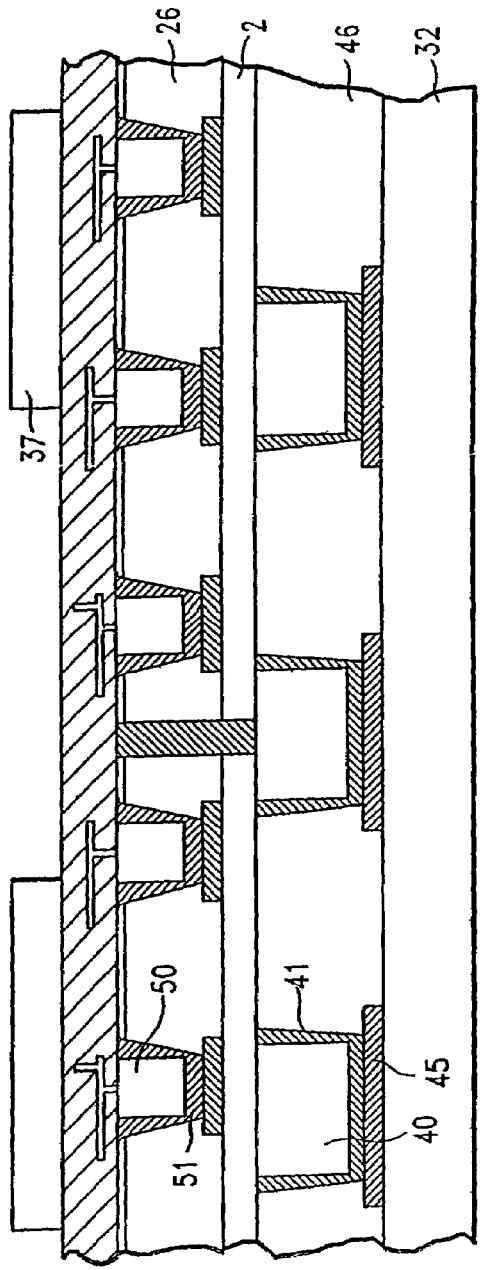
FIG. 4C
FIG. 8C

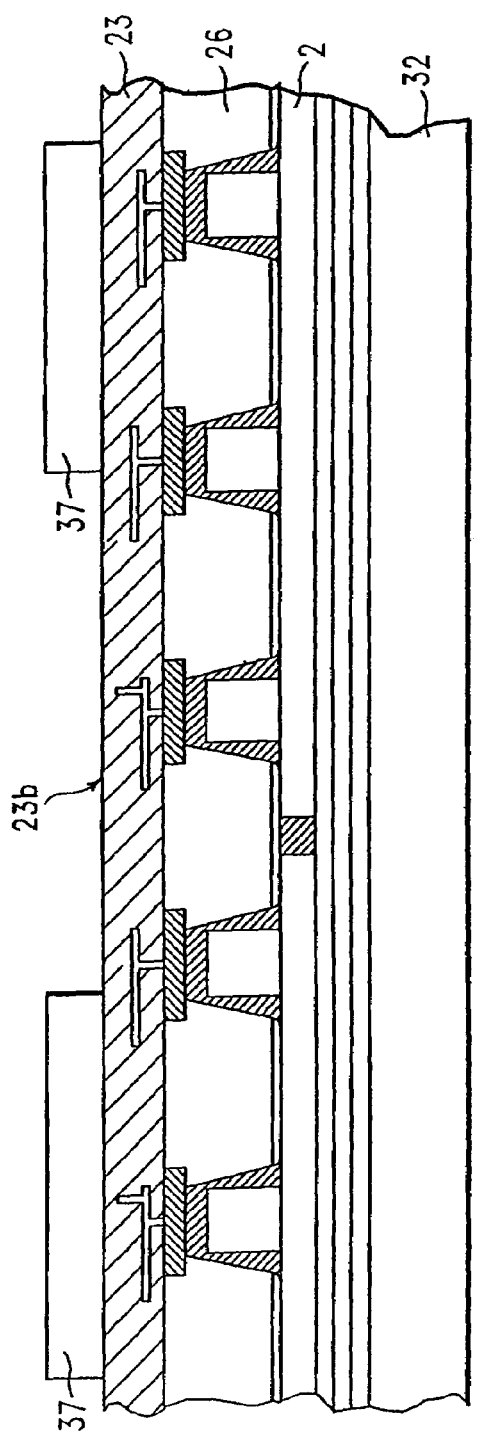
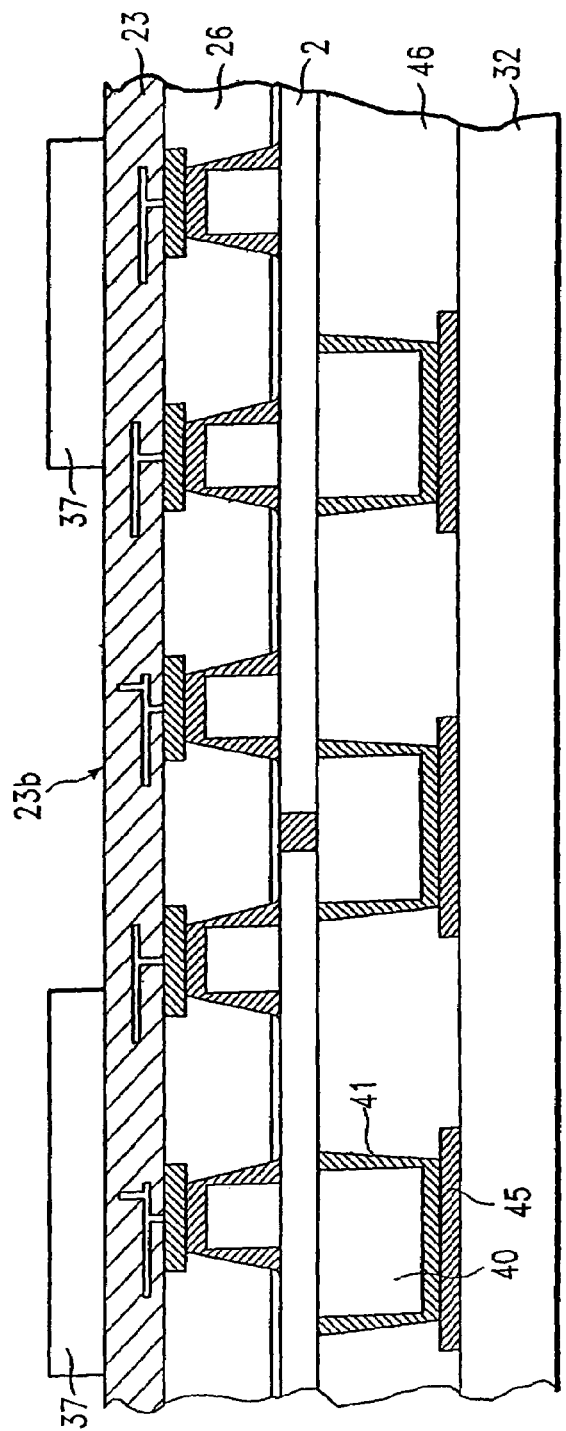
FIG. 6A
FIG. 6B

PROCESS FOR MAKING FINE PITCH CONNECTIONS BETWEEN DEVICES AND STRUCTURE MADE BY THE PROCESS

RELATED APPLICATION

This application is a division of application Ser. No. 10/213,872, filed Aug. 6, 2002, now U.S. Pat. No. 6,737,297, which is a continuation-in-part of application Ser. No. 09/669,531 filed Sep. 26, 2000 now U.S. Pat No. 6,444,560.

FIELD OF THE INVENTION

This invention relates to manufacturing of integrated circuit devices. More particularly, this invention relates to a process for interconnecting multiple devices (generally with different sizes, architectures and functions) at close proximity and with a very high wiring density.

BACKGROUND OF THE INVENTION

The need for greater functionality and performance in semiconductor devices has resulted in the development of larger and more complex chips. In addition, it is often desirable to include several different functions on a single chip to obtain a "system on a chip," which generally requires both an increased chip size and a more complicated manufacturing process. These factors both tend to depress manufacturing yield. It is estimated that many such complex chips, with areas greater than 400 mm$^2$, will generally have very low manufacturing yield (perhaps under 10%).

One method of maintaining acceptable yields is to manufacture smaller chips, and then to interconnect those chips on a single substrate or chip carrier. Besides improved manufacturing yield, another major advantage of this approach is that the individual chips may be of different sizes, perform different functions, or be fabricated by different or incompatible methods. A conventional method of joining a semiconductor device to a carrier involves the use of controlled-collapse chip connections (C4s). For example, U.S. Pat. No. 4,489,364, assigned to International Business Machines Corporation, discloses a ceramic chip carrier for supporting an array of chips by means of solder balls, such as C4s, to form a multichip module (MCM). As an example, as shown in FIG. 1, four separate chips 10 are mounted on a carrier 11; the carrier includes the wiring necessary to interconnect the chips. A C4 chip/carrier joining method typically requires an array of pads of about 100 μm diameter, with the pads at approximately a 200 μm pitch. Such MCMs tend to be expensive, due to their multilayered ceramic structure, and require significantly more area than the combined area of the chips. For devices which require a joining pitch below 150 μm, another method must be used.

To realize the advantages offered by the system-on-a-chip (SOC) concept, it becomes necessary for all of the different chip functions to be in very close proximity and have very precise alignment with respect to each other. The alignment and interconnection should also be performed with minimal added complexity in the overall process. In the case of an SOC, the interconnections should be made on top of the chips rather than in the chip carrier substrate. Furthermore, it is highly desirable that the passive components (resistors, capacitors, etc.) required for proper operation of the chips be located in close proximity to the chips.

There remains a need for a process for fabricating a device having a dense arrangement of chips and a high wiring density of chip-to-chip interconnections which can be practiced with high manufacturing yield.

SUMMARY OF THE INVENTION

The present invention addresses the above-described need by providing a method for fabricating a semiconductor device including a chip, in which very fine-pitch connections are made between chips by using matching stud/via structures.

According to a first aspect of the invention, a stud is provided on a first surface of a chip (the surface closest to the active area), and a first layer is formed on a plate which is transparent to ablating radiation. The first layer includes a conducting pad on a surface of the layer opposite the plate, and generally has electrical wiring therein for device interconnection. A second layer is formed on that surface of the first layer, and a via is formed in the second layer to expose the conducting pad; the alignment substrate, the first layer and the second layer form a temporary alignment structure. The stud on the chip surface is then aligned and inserted into the via, and the chip is attached to the alignment structure. The first surface of the chip thus contacts the second layer and the stud makes electrical contact with the conducting pad (so that a stud/via connection is made). A support is then attached to the chip (or array of chips) on the backside thereof. The interface between the first layer and the transparent plate is ablated using ablating radiation (typically laser radiation) transmitted through the plate, thereby detaching the plate.

The chip (or chip array) and the alignment structure may be fully bonded by performing a lamination process. To ensure thermal conductivity from the chip to the support material, the support may be attached by forming an alloy between metal layers deposited on the backside of the chip and on the top surface of the support. Alternatively, the chip array and support may be attached by forming stud/via connections (e.g. studs on the back surfaces of the chips with vias formed in a layer deposited on the support). If the chips are of different thicknesses, the chips are planarized (typically by grinding and/or chemical-mechanical polishing) before the support is attached.

The detaching and removal of the transparent plate exposes a surface of the first layer. In order to permit interconnection with other carriers, connection pads such as C4 pads are formed on this surface. Interconnection with other carriers may also be accomplished using stud/via connections instead of C4 connection pads.

According to a second aspect of the invention, a stud is provided on the first layer formed on the transparent plate, while a via is formed in a second layer on the first surface of the chip (that is, the positions of stud and via are reversed from the method described just above). The stud is aligned to the via, and the chip is attached to the alignment structure so that the first layer contacts the second layer and the stud makes electrical contact with the conducting pad.

After the stud and via are aligned, the chip and the alignment structure may be bonded by a lamination process, as noted above. The support substrate may also be attached by metallizing the chip and support and forming an alloy therebetween, or by making stud/via connections. If the chips are of different thicknesses, the chips are planarized. A backside support is then attached to the chip (or array of chips). The interface between the first layer and the transparent plate is ablated using ablating radiation transmitted through the plate, thereby detaching the plate.

According to another aspect of the invention, a semiconductor device is provided which includes a plurality of chips. A support is attached to the chips on the back surfaces thereof. A first layer is disposed on the front surfaces of the chips; this layer has a plurality of vias formed therein and conducting pads in registration with the vias. A plurality of studs, corresponding to the vias, are disposed in the vias. A second layer is attached to the first layer on a surface of the first layer opposite the front surfaces of the chips. This second layer is aligned to the first layer by the studs in the vias. The second layer includes electrical wiring connecting to the chips through the studs and the conducting pads.

The electrical wiring in the second layer makes electrical connections between the chips. The stud/via structures may be formed either with the studs in contact with the front surfaces of the chips or with the studs in contact with the second layer.

The support may be attached to the back surfaces of the chips by a metal alloy layer, or by a layer which includes stud/via structures. Electrical connection pads (such as C4 pads) may be provided on the second layer.

It should be noted that the chips may include chips with active devices and chips without active devices. In particular, the chips without active devices may have passive components fabricated thereon and connected with the active devices through the electrical wiring. Chips with passive components are advantageously located in proximity to the chips with active devices, in spaces left vacant by the placement thereof.

BRIEF DESCRIPTION OF THE DRAWINGS

FIGS. 3A–3E illustrate steps in a fabrication process for a device having a dense arrangement of chips, in accordance with the first embodiment of the invention.

FIGS. 4A–4C illustrate an alternative method of attaching the chip support shown in FIG. 3E.

FIGS. 6A and 6B illustrate further steps in the fabrication process according to the first embodiment of the invention, after removal of the transparent plate; FIGS. 6A and 6B show chip supports attached as in FIGS. 3E and 4C, respectively.

FIGS. 8A–8C illustrate steps in a fabrication process for a device having a dense arrangement of chips, in accordance with the second embodiment of the invention.

DETAILED DESCRIPTION OF THE PREFERRED EMBODIMENTS

In accordance with the present invention, a semiconductor device including a chip is fabricated using stud/via connections, as detailed below.

First Embodiment: Stud Formed on Device Chip

Figure 1:
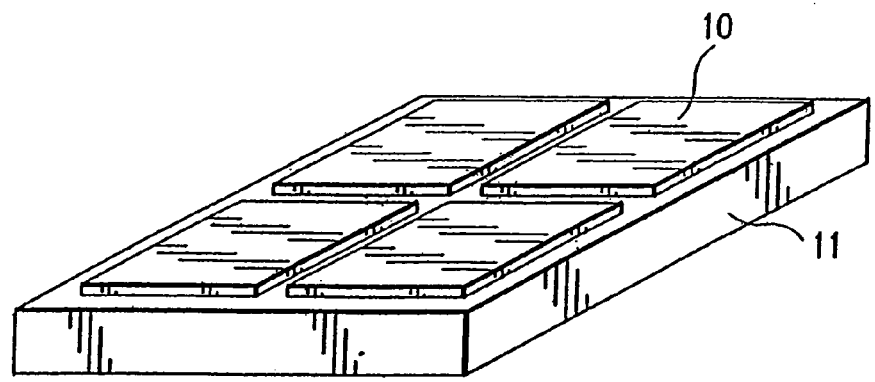
FIG. 1 shows a chip carrier on which four individual chips are mounted and through which the chips are interconnected.
Figure 2A:
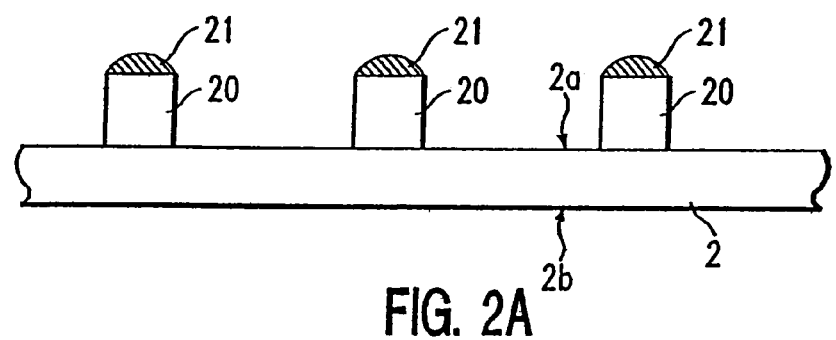
FIG. 2A is a schematic cross-sectional view of a semiconductor device or chip, according to a first embodiment of the invention.

In the first embodiment of the invention, chip 2 has metal studs 20 formed on the terminal surface 2a (see FIG. 2A). Studs 20 may be formed of Ni, Cu, Ni-plated Cu, W or some other metal or combination of metals. It is understood that the active areas of chip 2 are close to surface 2a; some material will be removed from the back surface 2b in a later processing step. The studs 20 protrude from surface 2a a distance which typically is 5 µm or less. A layer 21 of a low-melting-point alloy material is deposited on the surface of the stud; this facilitates formation of an electrical connection during the joining process. This material is typically 90/10 Pb/Sn solder, 2 µm or less thick; alternative alloy materials include Au/Sn and Sn/Ag. The alloy material may be subjected to a thermal reflow process so that layer 21 acquires a rounded shape, as shown in FIG. 2A; this facilitates alignment of the studs on the chip to vias on the alignment structure.

Figure 2B:
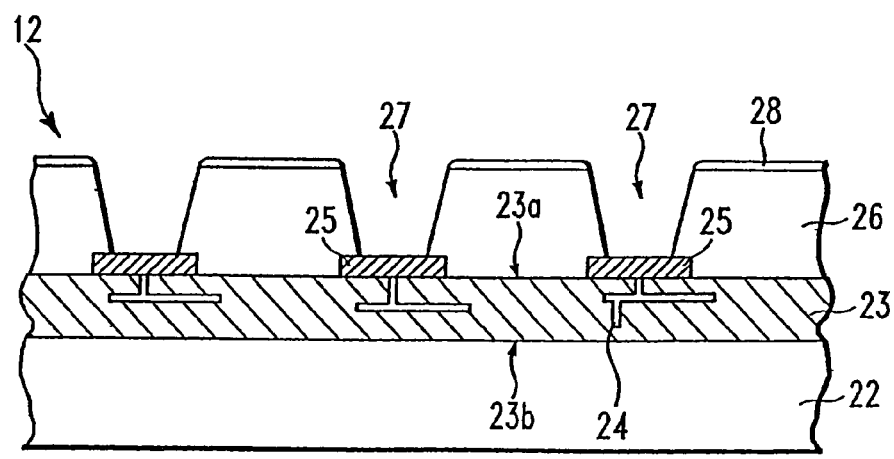
FIG. 2B is a schematic cross-sectional view of a temporary structure including a transparent plate for aligning and attaching the chip, according to the first embodiment of the invention.

FIG. 2B shows the structure of a temporary alignment structure 12, according to the first embodiment of the invention. The temporary alignment structure 12 includes a transparent plate 22 (such as boro-float glass from Schott Glasses). At this stage in the process, the transparent plate 22 has various layers disposed thereon; plate 22 is separated from those layers at a later stage of the process. Dielectric layer 23 (typically polyimide), on top of plate 22, has embedded therein high-density wiring 24 (generally several levels of Cu conductors, as shown schematically in FIG. 2B), and has electrical joining pads 25 on the surface 23a opposite plate 22. Although layer 23, including the conductors, is shown as a single layer, it will be appreciated that for ease of manufacturing it is often designed and fabricated as a multilayer structure. Pads 25 are typically Ni, but may also be Cu, Au, Co or a combination thereof. A dielectric layer 26 overlies the wiring layer 23; layer 26 may be formed of a polyimide material typically used in thin film packaging processing.

Layer 26 has vias 27 formed therein (e.g. by reactive-ion etching or by an excimer laser), so that a terminal metal joining pad 25 is at each via bottom. The thickness of layer 26 (and hence the depth of the vias 27) is chosen to match the height of the studs 20.

As shown in FIG. 2B, the vias may be formed with a sloped wall angle as a guide for high-accuracy, self-aligned placement of the studs 20 in the vias 27. The wall angle of the via may be tailored to be either near-vertical or sloped. A near-vertical profile can be obtained if the vias are formed by RIE. It has been noticed that stud/via alignment is readily accomplished when the wall angle is 65°; a via with this wall angle may conveniently be obtained when an excimer laser is used to form the via.

A thin coating 28 of thermoplastic polymer adhesive may be deposited on the top of the dielectric layer 26, to ensure reliable bonding to the chip surface 2a. Alternatively, the entire layer 26 may be formed of adhesive material. An adhesive layer may be deposited on surface 2a of chip 2 in addition to, or instead of, layer 28.

Figure 3E:
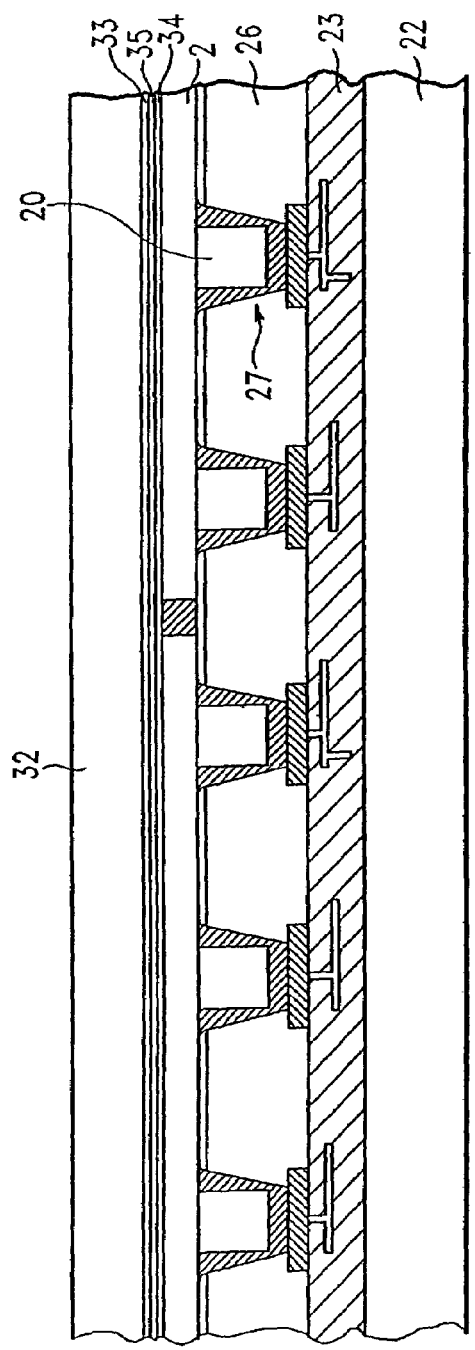

The process for aligning and mounting multiple chips 2 to the alignment structure 12, in accordance with the first embodiment of the invention, is shown in FIGS. 3A–3G. The chips are aligned to the alignment structure 12 by placing studs 20 in corresponding vias 27. As is understood by those skilled in the art, an automated alignment tool may be used to align the chips to the alignment structure; if such a tool is used, the matching of the stud pattern to the via pattern can be made with a pitch of less than 1 μm. Alternatively, the alignment may be done optically, by viewing an alignment mark on surface 2a of chip 2 through the transparent plate 22; in that case a viewing hole must be formed in layers 23 and 26. Since the system may be built from chips having different functions and originating from different device wafers, adjacent chips may have different thicknesses, as shown in FIG. 3A.

Each chip 2 may be temporarily held in position relative to the alignment structure 12, while alignment and placement of other chips is performed. This may be done by using focused infrared heating to melt solder on a selected stud (e.g. solder 21t on stud 20t), thereby "spot welding" the stud to the corresponding joining pad 25t. It will be appreciated that such heating should be performed outside an active device area of the chip, as heating through the device area should be avoided. Adhesive or solder fuses may also be used at specified locations on the front surface 2a of the chip, so that the chip is temporarily held to corresponding portions of the alignment structure.

Alternatively (even if adhesive layer 28 is not used), chip 2 may be temporarily held in position by performing the alignment procedure at an elevated temperature, so that the surface of polyimide layer 26 is slightly "tacky" before being brought into contact with surface 2a of chip 2.

After all of the chips 2 have been aligned and temporarily held or "tacked" to the alignment structure, a lamination process is performed to permanently attach the chips to layers 23 and 26 (see FIG. 3B). The lamination process is typically performed at elevated temperature and pressure, to ensure (1) stud/via registration; (2) vertical metal bonding between the studs 20 and via joining pads 25; and (3) bonding of the chips 2 to layer 26 (and to any material therebetween). Depending on the materials used, the temperature may be in the range 200° C.–400° C. and the pressure may be in the range 10 psi–200 psi. As shown in FIG. 3B, the lamination process causes the solder 21 to flow so that solder either partially or completely fills via 27.

To build a dense array of chips (so as to arrive at an optimum performance integrated system-on-a-chip structure), it is desirable that the gaps 30 between adjacent chips be as narrow as possible (see FIGS. 3A and 3B). After the lamination process, the gaps 30 between chips may be fully or partially filled with a suitable material 31, such as thermoset epoxy or another organic material (FIG. 3C). If a gap fill process is performed, gaps 30 have a minimum size determined by the filling procedure used. The different chips will typically have their thicknesses reduced and preferably made uniform in a later processing step; accordingly, if a gap fill process is performed the gaps 30 need only be filled to a level matching their eventual uniform thickness.

The chips are then thinned and planarized to have a uniform thickness, preferably by grinding and chemical-mechanical polishing (CMP) of their back surfaces 2b. As shown in FIG. 3D, the result of this process is that the various chips have a uniform planar back surface 2p with respect to each other.

A chip support 32 (typically a Si wafer) is then bonded to the planarized back surface 2p of the chips, as shown in FIG. 3E. If the system has only low-power (~1 W) chips, this bonding may be performed using an insulating adhesive.

However, if the system includes high-power chips, it is necessary to allow for heat transfer away from the chips; the bonding material must then be thermally conductive. A thermally conductive bond between chips 2 and support 32 may be obtained by a metal alloying process, in which an alloy is formed between metallized surfaces of the planarized chips 2 and the chip support 32. To create this conductive layer, the chip support 32 is first coated with a layer 33 to ensure adhesion of the conductive layer to the chip support surface; for example, this layer may be a Ti/TiN combination or TiW. A similar layer 34 is deposited on the back surface 2p of the chips. The two layers 33, 34 are then placed together facing each other, with an alloying layer 35 placed between them (see FIG. 3E). Alloying layer 35 is preferably a metal (e.g. Sn) or combination of metals (e.g. Au—Sn) which permits bonding below 400° C., in order to be compatible with previously processed materials. Using a slightly crushable Sn foil between the two layers 33, 34 ensures good mechanical contact before alloying. Alternatively, an additional layer with suitable eutectic properties may be deposited on each bonding layer 33, 34, and the two surfaces then brought into direct contact. Applying a heat treatment (below 400° C.) results in formation of an alloy between layer 35 and each of layers 33 and 34. Another low cost alternative, which is known in the art, is to coat one surface with Au or Au/Si which becomes a bonding layer at 400° C.

An alternative process for obtaining a thermally conductive bond between chips 2 and support 32 is shown in FIGS. 4A–4C. This process uses a stud/via matching technique, similar to that described above. Metal studs 40 are formed on the planarized surface 2p of the chips. These studs may be the same metal as studs 20, or may be of Cu to ensure thermal conductivity. A layer of solder 41 may be applied to the surface of the stud. Chip support 32 has conducting pads 45 deposited thereon, with a polyimide layer 46 overlying the pads (FIG. 4B). The polyimide layer 46 has vias 47 formed therein to expose pads 45. The studs 40 on chips 2 are then aligned to the vias 47, and a lamination process is performed to permanently attach the chip support 32 (FIG. 4C). As shown in FIG. 4C, the size and pitch of studs 40 and vias 47 may be much greater than those of the wiring interconnection studs 20 and vias 27.

It will be appreciated that a stud/via connection between the support 32 and chips 2 may also be realized by reversing the positions of studs and vias shown in FIGS. 4A–4C; that is, studs 40 may be formed on support 32 while conducting pads 45 and layer 46 are deposited on planarized surface 2p.

It should be noted that the chip support 32 can be of any convenient size and shape to accommodate the chips. In particular, if the chips are generally rectangular, the substrate may also be rectangular.

Figure 5:
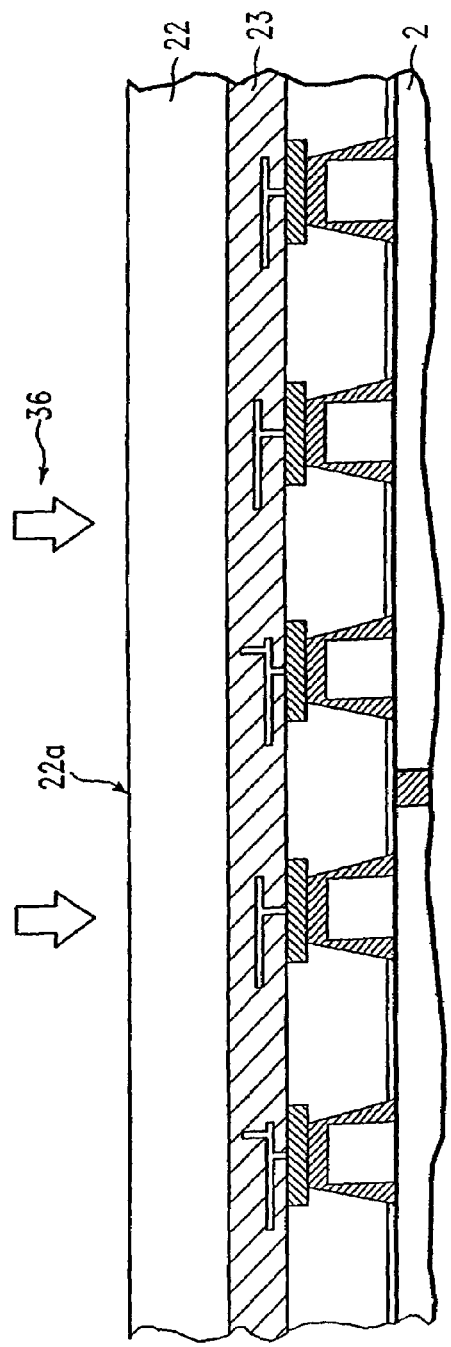
FIG. 5 illustrates the use of ablating radiation to detach the transparent plate.

The structure shown in FIG. 3E (alternatively, FIG. 4C) is then subjected to a laser ablation process. As shown schematically in FIG. 5, laser radiation 36, incident on surface 22a of transparent plate 22, penetrates the plate and ablates the interface between the plate and the polyimide of layer 23. (Some details of the laser ablation process are provided in U.S. Pat. No. 5,258,236, assigned to the assignee of the present invention; the disclosure of this patent is incorporated herein by reference.) This results in delamination of the plate from layer 23, so that plate 22 may be removed.

The chip support 32 thus becomes the support for the chips, the wiring layer, and the stud/via connections therebetween.

With plate 22 removed, surface 23b of layer 23 is exposed. C4 pads 37 are then formed on this surface (or are exposed if already present), so that the interconnected chips may be joined to an appropriate carrier. The device then appears as shown in FIG. 6A, if the chip support 32 is attached using a metallization and alloying process (see FIG. 3E). Alternatively, if a stud/via connection process is used to attach chip support 32 (see FIGS. 4A–4C), the device appears as shown in FIG. 6B. It should be noted that the size and pitch of the C4 pads 37 is much greater than that of the studs 20 or vias 27.

Figure 6C:
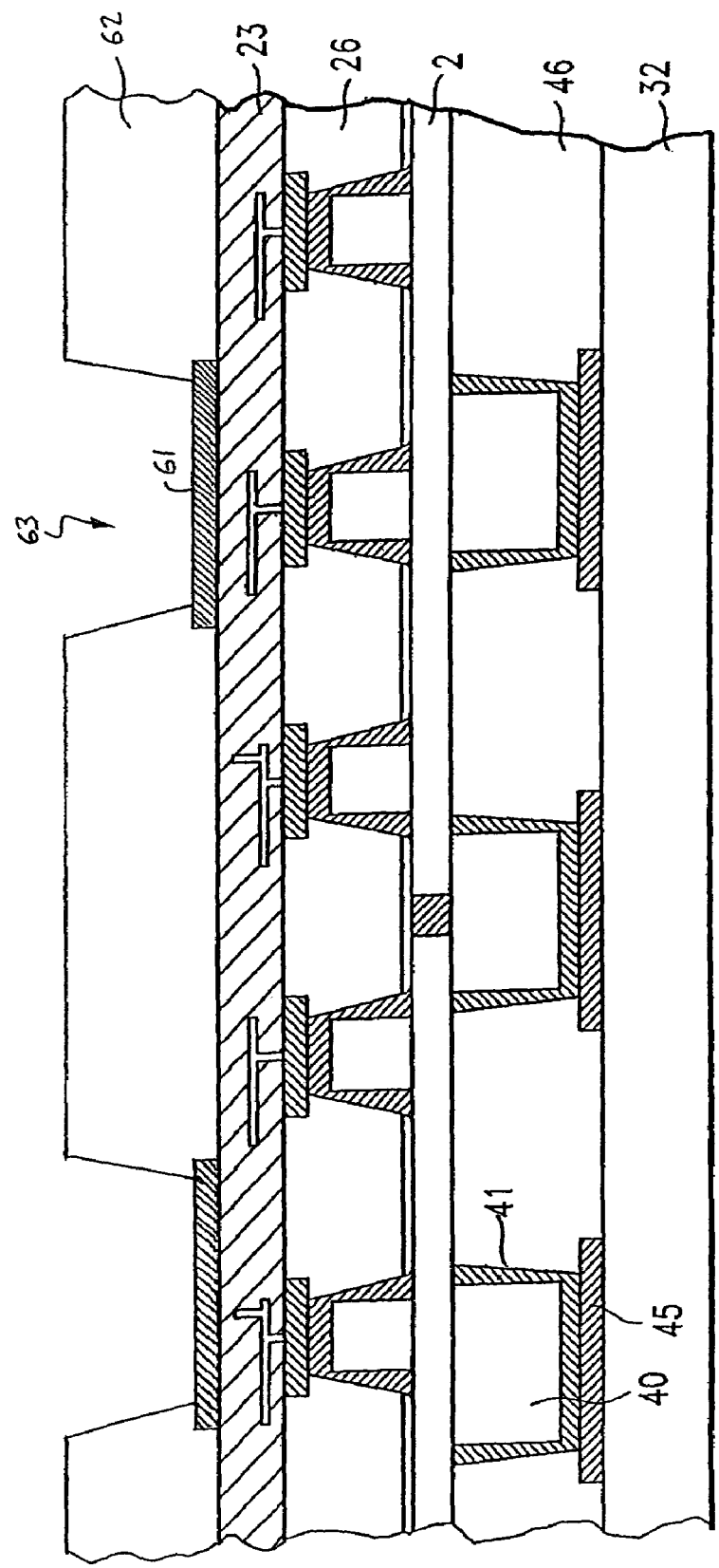
FIG. 6C shows fabrication of interconnects using stud/via connections as an alternative to the C4 interconnections of FIGS. 6A and 6B.

Additional levels of interconnection may also be formed using stud/via connections instead of C4 pads. For example, as shown in FIG. 6C, conducting pads 61 may be formed on surface 23b of the wiring layer 23 and then covered with a polyimide layer 62, which then has interconnect vias 63 formed therein to expose pads 61. These vias are then aligned to interconnect studs on the chip carrier (not shown). It will be appreciated that the interconnect studs and vias may be reversed (that is, studs may instead be formed on surface 23b to match vias on the chip carrier).

Second Embodiment: Vias Formed on Device Chips

Figure 7A:
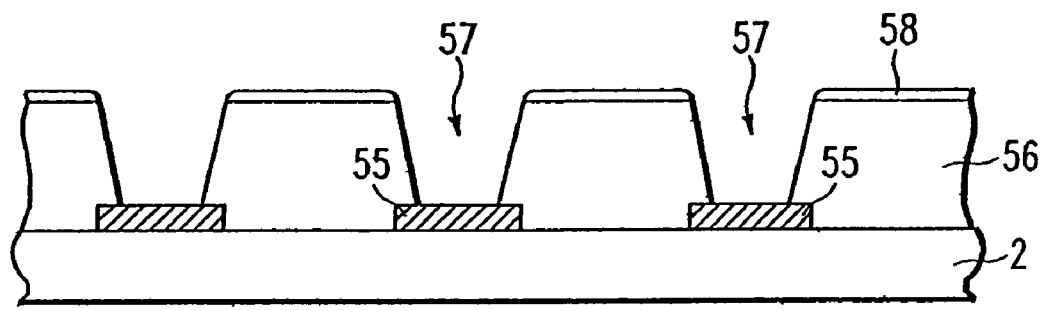
FIGS. 7A and 7B are schematic cross-sectional views of a chip and temporary alignment structure, respectively, according to a second embodiment of the invention.
Figure 7B:
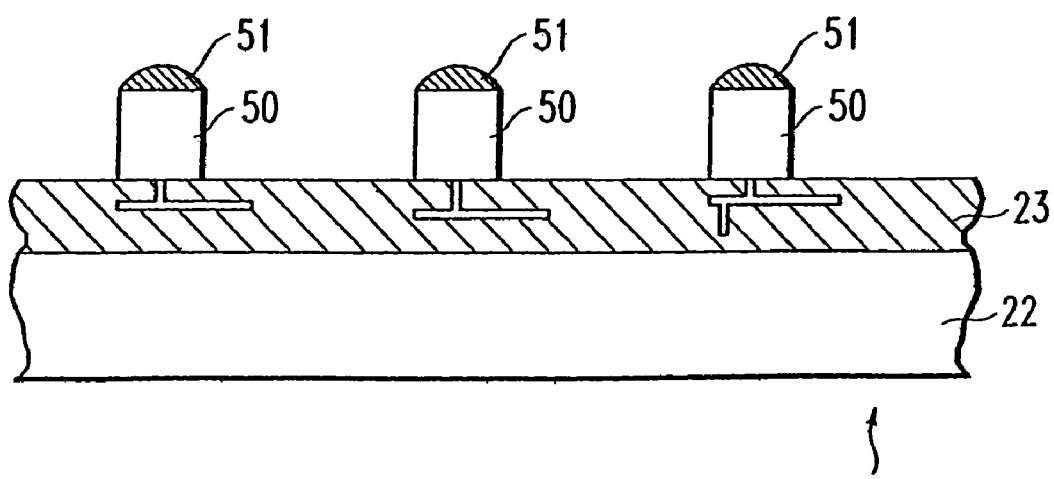

In a second embodiment of the invention, a similar stud/via joining process is used to join the chips and the wiring layer, but the positions of studs and vias are reversed. As shown in FIG. 7A, chip 2 has disposed thereon conducting pads 55, dielectric layer 56 with vias 57, and thermoplastic adhesive layer 58. Temporary alignment structure 12, including transparent plate 22 and high-density wiring layer 23, has studs 50 with solder layers 51 (FIG. 7B).

Figure 8A:
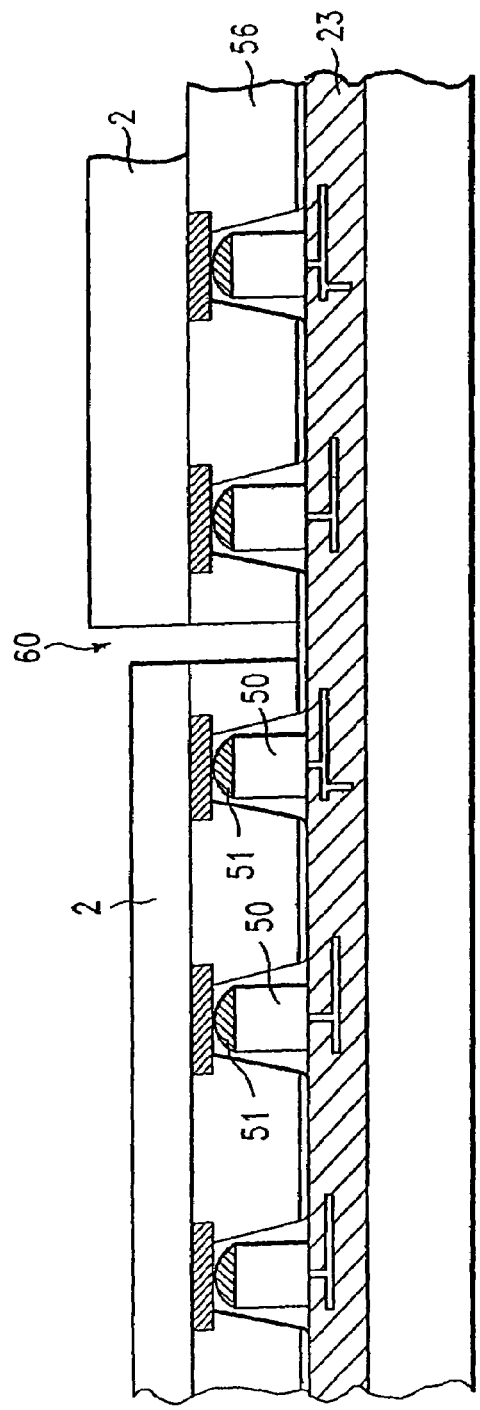
Figure 8B:
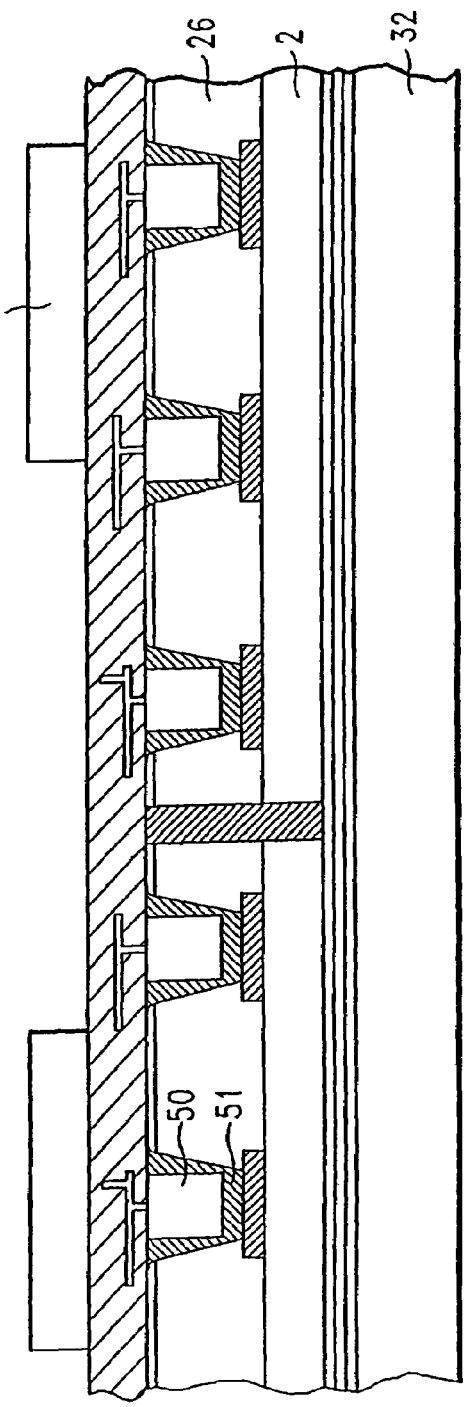

The chips and alignment structure are then aligned as in the first embodiment, resulting in the arrangement shown in FIG. 8A. Further processing, including lamination, optionally filling the gap 60, planarizing the chips and attaching chip support 32, also proceeds as in the first embodiment. If the chip support is attached using a metallization/alloying process, the resulting structure is as shown in FIG. 8B (compare FIG. 6A). If the chip support is attached using a stud/via connection process with studs on the planarized back surface of the chips, the resulting structure is as shown in FIG. 8C (compare FIG. 6B).

Figure 8D:
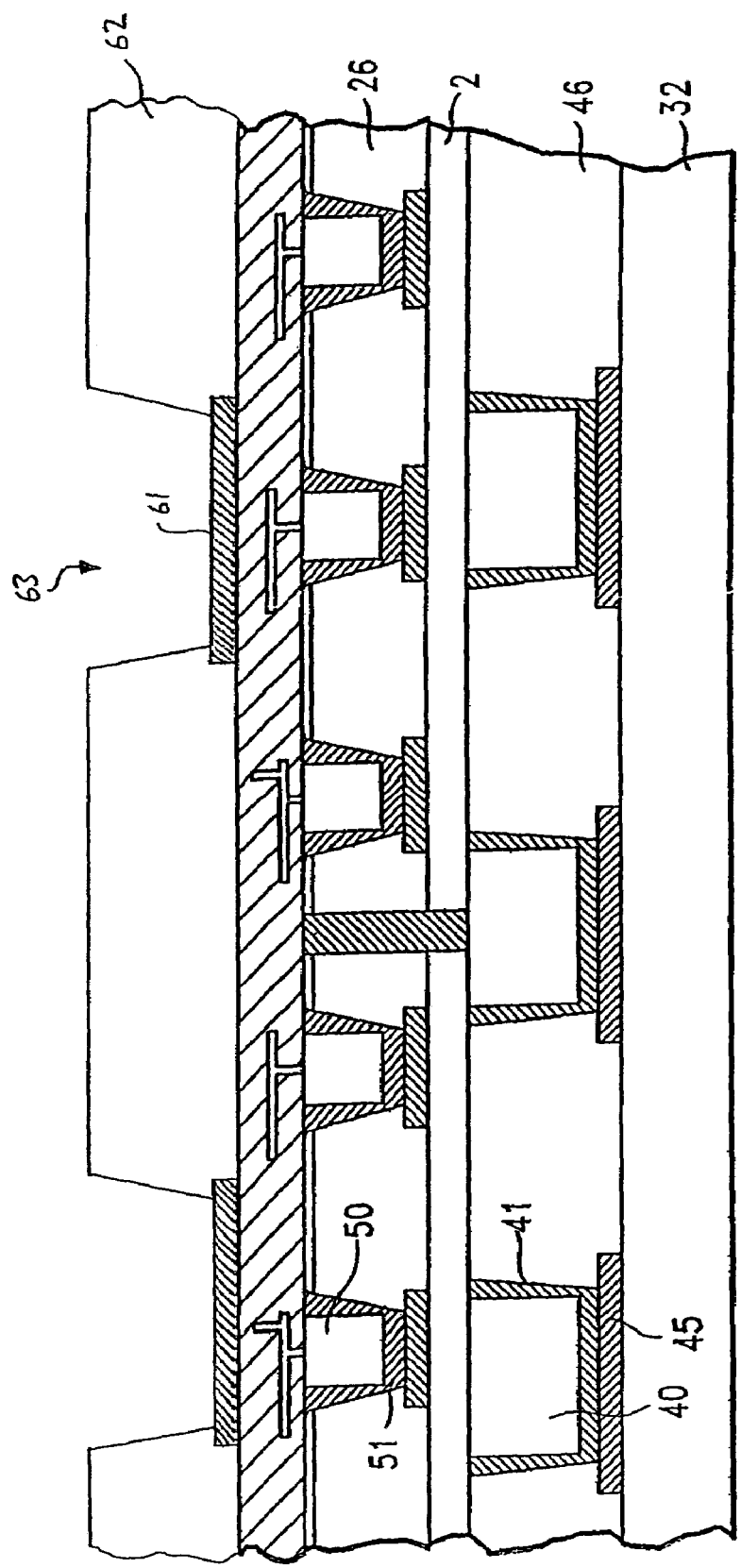
FIG. 8D shows fabrication of interconnects using stud/via connections as an alternative to the C4 interconnections of FIGS. 8B and 8C.

Furthermore, the interconnection C4 pads may be replaced by a stud/via arrangement, as in the first embodiment, as shown for example in FIG. 8D (compare FIG. 6C).

Integration of Passive Components

Figure 9A:
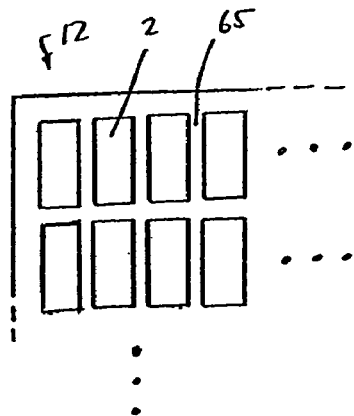
FIGS. 9A–9C illustrate an additional aspect of the invention in which passive devices are located in spaces between chips.
Figure 9B:
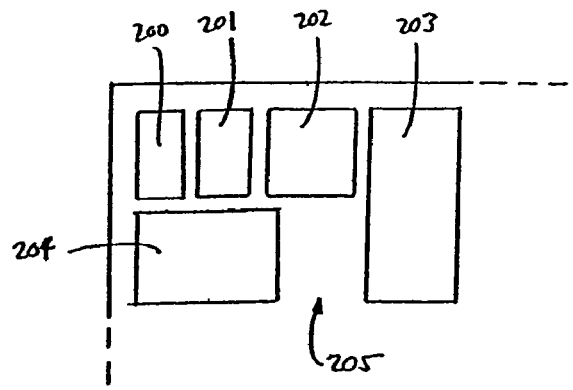

In both of the embodiments discussed above, it is desirable that all the chips 2 have common dimensions so that the chips may be arranged in a uniform, rectangular format with narrow gaps 65 between the chips, as shown in FIG. 9A (which may be understood as a plan view of either FIG. 3A or FIG. 8A). However, as noted above, in actual practice the chips may be supplied by a variety of manufacturers and be of various dimensions. This may result in a situation where the placement pattern of the chips cannot avoid wasted space, as shown in FIG. 9B; chips 200–204 are interconnected and are in close proximity, but their varying sizes leave a vacant space 205 in the midst of the chip arrangement. This situation not only wastes space but also may create processing difficulties.

It should be noted that passive components (e.g. resistors, capacitors etc.) must generally be interconnected with the device chips, to allow proper functioning of the devices. It is possible to build the passive components on top of the device chips, but this approach severely limits processing temperatures and hence the choice of materials used in the fabrication of the passive components.

Figure 9C:
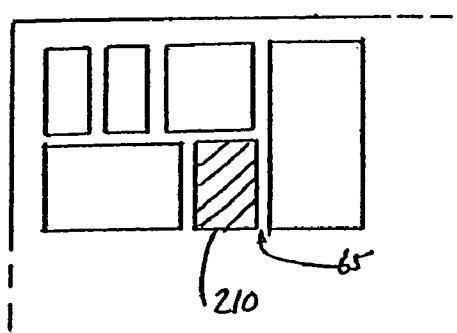

The system-on-a-chip structure is improved by fabricating the required passive components on a separate chip 210 which is sized to fit in the space 205 (see FIG. 9C). The passive components on chip 210 are interconnected with the device chips through wiring layer 23, as described above. This arrangement not only makes use of the vacant space, but also offers processing and performance advantages. Fabricating the passive components on a separate chip (as opposed to on top of the device chip, for example) permits greater freedom of material choices and a wider range of processing temperatures, thereby providing the opportunity to create optimized passive components. Furthermore, locating the passive components adjacent to the device chips (as opposed to being fabricated in the substrate, for example) provides greater opportunities for improved chipset performance.

Alternatively, in the event that the passive components are provided elsewhere in the structure, processing difficulties may be avoided by filling space 205 with a dummy piece of silicon (in place of chip 210) to maintain a uniformly sized gap 65 between the chips.

System Design Advantages

The chip connection method described herein permits greatly increased wiring density for chip-to-chip interconnections, thereby realizing higher device bandwidth. Furthermore, with this method the need for conventional C4 chip-to-chip connections is eliminated; the complexity of the carrier substrate is therefore reduced. More space thus becomes available for a system designer to allocate C4s to meet other requirements; this in turn offers opportunities to design more advanced device structures.

In addition, this method permits both highly accurate chip placement with vertical interconnections on the front side of the chips and assured thermal conductivity on the backside of the chips. Furthermore, by using direct wiring interconnections, the overall chip signal fidelity is significantly improved (especially for high-frequency devices), and power requirements are reduced.

As noted above, this method is applicable to form large-area chips, chips with mixed functions, and chips fabricated with various (perhaps incompatible) processes. Accordingly, this method is especially useful for specialized, high-functionality chips such as ASICs, wireless chips and A/D convertor chips, among others.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A semiconductor device including a plurality of chips, the chips having front surfaces and back surfaces, the device comprising:
   a support attached to the chips on the back surfaces thereof, the chips being arranged on the support in a planar horizontal structure with a previously formed filling between the chips;
   a first layer formed of a solid dielectric material and having a first surface and an opposing second surface, the first layer being disposed on the front surfaces of the chips, the first surface being in contact with the front surfaces of the chips so that the chips separate the first layer from the support, the first layer having a plurality of vias formed therein;

a plurality of studs corresponding to the vias and disposed therein; and a second layer attached to the first layer on a the second surface of the first layer, the second layer being formed of a solid dielectric material and having conducting pads on a surface thereof in contact with the first layer, the conducting pads being in registration with the vias so that each conducting pad forms an end of the corresponding via, the second layer including electrical wiring connecting to the chips through the studs and the conducting pads, at least a portion of the electrical wiring running within the second layer from one conducting pad to another conducting pad for making electrical connection between the chips, wherein said plurality of chips includes chips with active devices and a chip without active devices.

2. A semiconductor device according to claim 1, further comprising an attachment layer between the support and the chips, wherein the attachment layer has a plurality of support connection vias formed therein, support connection pads in registration with the support connection vias, and a plurality of support connection studs disposed in the support connection vias and connected to the support connection pads.

3. A semiconductor device according to claim 1, wherein the chip without active devices has passive components fabricated thereon.

4. A semiconductor device according to claim 1, wherein the chip without active devices has a size according to a placement pattern of the chips with active devices.

* * * * *